(12) United States Patent
Dandin (10) Patent No.: US 10,594,306 B2
(45) Date of Patent: Mar. 17, 2020

(54) DELAY CIRCUIT WITH DUAL DELAY RESOLUTION REGIME

(71) Applicant: KISKEYA MICROSYSTEMS LLC, College Park, MD (US)

(72) Inventor: Marc Péralte Dandin, Rockville, MD (US)

(73) Assignee: KISKEYA MICROSYSTEMS LLC, Rockville, MD (US)

( * ) Notice: Subject to any disclaimer, the term of this patent is extended or adjusted under 35 U.S.C. 154(b) by 494 days.

(21) Appl. No.: 15/496,924

(22) Filed: Apr. 25, 2017

(65) Prior Publication Data

US 2017/0230037 A1    Aug. 10, 2017

Related U.S. Application Data

(63) Continuation of application No. 15/407,683, filed on Jan. 17, 2017, now Pat. No. 9,671,284.

(Continued)

(51) Int. Cl.
*H03K 5/134* (2014.01)
*H01L 31/02* (2006.01)
(Continued)

(52) U.S. Cl.
CPC ............ *H03K 5/134* (2014.07); *G01J 1/44* (2013.01); *H01L 31/02027* (2013.01);
(Continued)

(58) Field of Classification Search
CPC ........ H03K 5/134; H03K 5/133; H03K 5/131; H03K 5/13; H03K 5/1534; H03K 5/153; H03K 2005/00026; H03K 2005/00156; H03K 2005/0015; H03K 2005/00195; H03K 17/74; G01J 1/44; G01J 2001/442;
(Continued)

(56) References Cited

U.S. PATENT DOCUMENTS 3,817,582 A * 6/1974 Green .................... H03H 11/20
                                                        327/251
4,945,227 A * 7/1990 Jones ........................ G01J 1/44
                                                        250/214 R (Continued)

FOREIGN PATENT DOCUMENTS

EP    0365095    4/1990
EP    1132725    9/2001

OTHER PUBLICATIONS

B. Leung, "VLSI for Wireless Communication," Chapter 7, pp. 298-305, Prentice Hall, Upper Saddle River, New Jersey, USA, 2002, (No month).

(Continued)

*Primary Examiner* — John R Lee (57) ABSTRACT

A delay circuit is provided. The delay circuit includes a first regulator and a second regulator, each of which is independently selectable based on a selection signal applied to a selection terminal of the delay circuit. Furthermore, the delay circuit is configurable in one of two distinct delay resolution regimes, each corresponding to only one edge an input signal being actively delayed by the delay circuit when one of the first regulator and the second regulator is enabled and the other one of the first regulator and the second regulator is turned off.

20 Claims, 7 Drawing Sheets

Related U.S. Application Data (60) Provisional application No. 62/435,586, filed on Dec. 16, 2016, provisional application No. 62/278,585, filed on Jan. 14, 2016.

(51) Int. Cl.
*H01L 31/107* (2006.01)
*H03H 11/26* (2006.01)
*H03K 17/74* (2006.01)
*G01J 1/44* (2006.01)
*H03K 5/1534* (2006.01)
*H03K 5/00* (2006.01)
*H03K 5/133* (2014.01)

(52) U.S. Cl.
CPC ......... *H01L 31/107* (2013.01); *H03H 11/265* (2013.01); *H03K 5/1534* (2013.01); *H03K 17/74* (2013.01); *G01J 2001/442* (2013.01); *G01J 2001/4466* (2013.01); *H03K 5/133* (2013.01); *H03K 2005/00026* (2013.01); *H03K 2005/00156* (2013.01)

(58) Field of Classification Search
CPC ....... G01J 2001/4413; G01J 2001/4446; G01J 2001/4466; H01L 31/02027; H01L 31/02019; H01L 31/02016; H01L 31/02; H01L 31/107; H01L 31/102; H01L 31/101; H01L 31/10; H01L 31/09; H03H 11/265; H03H 11/26
See application file for complete search history.

(56) References Cited

U.S. PATENT DOCUMENTS

| | | | | |
|---|---|---|---|---|
| 4,963,727 | A * | 10/1990 | Cova | G01J 1/44 250/214 R |
| 5,168,154 | A * | 12/1992 | Harley | G01J 1/44 250/214 R |
| 5,194,727 | A * | 3/1993 | Johnson | G01J 1/44 250/214 R |
| 5,396,110 | A | 3/1995 | Houston | |
| 5,532,474 | A * | 7/1996 | Dautet | H03K 17/0416 250/214 R |
| 5,933,042 | A * | 8/1999 | Trottier | H03K 17/0416 327/326 |
| 6,046,619 | A * | 4/2000 | Pascucci | H03K 5/1534 327/262 |
| 6,384,663 | B2 * | 5/2002 | Cova | G01J 1/44 250/214 A |
| 6,541,752 | B2 * | 4/2003 | Zappa | G01J 1/44 250/214.1 |
| 7,897,906 | B2 * | 3/2011 | Deschamps | H03K 17/0416 250/214 R |
| 8,026,471 | B2 | 9/2011 | Itzler | |
| 8,259,293 | B2 | 9/2012 | Andreou | |
| 8,395,127 | B1 | 3/2013 | Frach | |
| 8,766,164 | B2 | 7/2014 | Sanfilippo | |
| 8,822,900 | B2 | 9/2014 | Richardson | |
| 8,947,659 | B1 * | 2/2015 | Baastians | H01L 31/107 356/301 |
| 9,012,860 | B2 | 4/2015 | Nyman | |
| 9,671,284 | B1 * | 6/2017 | Dandin | H01L 31/02027 |
| 2001/0020673 | A1 * | 9/2001 | Zappa | G01J 1/44 250/214 R |
| 2001/0020863 | A1 * | 9/2001 | Cova | G01J 1/44 327/514 |
| 2007/0280025 | A1 * | 12/2007 | Takahashi | G11C 5/145 365/226 |
| 2008/0231339 | A1 * | 9/2008 | Deschamps | H03K 17/0416 327/326 |
| 2009/0236501 | A1 * | 9/2009 | Takahashi | G01J 1/44 250/214 R |
| 2013/0069703 | A1 * | 3/2013 | Gasper | H03H 11/265 327/264 |
| 2014/0191115 | A1 * | 7/2014 | Webster | H01L 31/107 250/214 R |
| 2016/0248411 | A1 * | 8/2016 | Chern | H03K 5/131 |
| 2017/0047917 | A1 * | 2/2017 | Heo | H03K 5/131 |
| 2017/0230037 | A1 * | 8/2017 | Dandin | H01L 31/02027 |
| 2018/0294803 | A1 * | 10/2018 | Huang | H03K 5/14 |

OTHER PUBLICATIONS

M. Dandin et al., "Characterization of Single-Photon Avalanche Diodes in a 0.5 µm Standard CMOS Process—Part 2: Equivalent Circuit Model and Geiger Mode Readout," IEEE Sensors Journal, vol. 16, No. 9, pp. 3075-3083, 2016, (No month).

M. Dandin et al., "Characterization of Single-Photon Avalanche Diodes in a 0.5 µpm Standard CMOS Process—Part 1: Perimeter Breakdown Suppression," IEEE Sensors Journal., vol. 10, No. 11, pp. 1682-1690, 2010, (No month).

M. Dandin et al., "High Signal-to-Noise Ratio Avalanche Diodes with Perimeter Field Gate and Active Readout," IEEE Electron Device Letters, vol. 33, No. 4, pp. 570-572, 2012, (No month).

B. Nouri et al. "Large-Area Low-Noise Single-Photon Avalanche Diodes in Standard CMOS", in proceedings of IEEE Sensors Conference (ISC), Taipei, Taiwan, pp. 1-5, 2012, (No month).

A. Akturk et al. "Silicon Carbide Ultraviolet Photodetector Modeling, Design and Experiments," Materials Science Forum, vols. 717-720, pp. 1199-1202, 2012, (No month).

M. Dandin et al., "Optoelectronic Characterization of 4H-SiC Avalanche Photodiodes Operated in DC and in Geiger Mode," in proceedings of IEEE International Semiconductor Device Research Symposium (ISDRS), College Park, Maryland, USA, pp. 1-2, 2011, (No month).

B. Nouri et al., "Characterization of Single-photon Avalanche Diodes in Standard CMOS," in IEEE Sensors Conference, Christchurch, New Zealand, 2009, pp. 1889-1892, (No month) (No month).

N. Nelson et al., "A Handheld Fluorometer for Measuring Cellular Metabolism," in IEEE International Symposium on Circuits and Systems, Seattle, Washington, USA, 2008, pp. 1080-1083, (No month).

M. Dandin et al., "Single-Photon Avalanche Detectors in Standard CMOS," in IEEE Sensors Conference, Atlanta, Georgia, USA, 2007, pp. 585-588, (No month).

N. Nelson et al., "A Hand-held Fluorometer for UV-Excitable Fluorescence Assays," in IEEE Biomedical Circuits and Systems Conference, Montréal, Québec, Canada, 2007, pp. 111-114, (No month).

N. Nelson et al., "Hand-held Fluorometers for Lab-on-a-Chip Applications," IEEE Trans. Biomed. Circuits Syst., vol. 3, pp. 97-107, 2009, (No month).

* cited by examiner

FIG. 7

DELAY CIRCUIT WITH DUAL DELAY RESOLUTION REGIME

CROSS-REFERENCE TO RELATED APPLICATIONS

The present disclosure is a Continuation of Non-Provisional U.S. patent application Ser. No. 15/407,683, filed on Jan. 17, 2017, which claims the benefit of U.S. Provisional Patent Application No. 62/278,585, filed on Jan. 14, 2016, and the benefit of U.S. Provisional Patent Application No. 62/435,586, filed on Dec. 16, 2016. The disclosures of all three prior applications are incorporated herein in their entirety by reference.

BACKGROUND

This disclosure relates to single-photon avalanche diodes, their associated readout circuits, and, without limitation, to perimeter-gated single photon avalanche diodes, delay elements, hold-off circuits, quenching circuits, and reset circuits. Furthermore, this disclosure relates, without limitation, to single-photon avalanche diode arrays, pixels, and their associated readout circuits.

The background description provided below is for the purpose of generally presenting the context of the disclosure. The work described in this background section and aspects of the disclosure that may not otherwise qualify as prior art at the time of filing are neither expressly nor impliedly admitted as prior art against this disclosure.

Single-photon avalanche diodes are typically used for detecting weak and fast optical signals, and they are used in a wide variety of fields. For example, they are used in biomedical and biochemical assays to monitor fast-decaying optical signals originating from analytes. They are also used in light ranging applications as well as in telecommunications and quantum cryptography applications.

Readout circuits for single-photon avalanche diodes vary in architecture, and their design depends strongly on the application for which a detector is designed. However, one key feature common to virtually all readout circuits is the ability to quench an avalanche current in the single-photon avalanche diode and to optionally hold the single-photon avalanche diode in the quenched state for a period of time before returning it to its initial state.

Typical readout circuits are designed to hold the single-photon avalanche diode for a pre-determined period of time. For example, some readout circuit architectures include a monostable multivibrator that is configured to keep the single-photon avalanche diode biased at a quenching voltage for the duration of the unstable state of the multivibrator. In other typical implementations, a timing circuit may be used to provide a well-defined hold-off period.

Several drawbacks exist with respect to typical hold-off time generation circuits. For example, typical hold-off time generation circuits, such as those described above, may have a fixed delay time, and it may be prohibitive to include hardware for controlling these circuits in-pixel in detectors that include an array of single-photon avalanche diodes. Another drawback may be that typical hold-off time generation circuits do not provide the capability to generate a wide range of time delays at different resolutions, even when their resulting hold-off time is adjustable.

SUMMARY

One example embodiment provides a circuit that includes a single-photon avalanche diode. The circuit further includes a delay element comprising a first regulator and a second regulator, each of which is independently selectable based on a selection signal applied to a selection terminal of the delay element. The delay element is configured to receive, at an inverting section, a signal indicative of an avalanche event in the single-photon avalanche diode. Furthermore, the delay element is configurable in one of two distinct delay resolution regimes, each corresponding to only one edge of the event signal being actively delayed by the delay element when one of the first regulator and the second regulator is enabled and the other one of the first regulator and the second regulator is turned off.

Another example embodiment provides a circuit that includes a perimeter-gated single-photon avalanche diode. The circuit further includes a hold-off circuit configured to quench the perimeter-gated single-photon avalanche diode for a fixed amount of time, and the hold-off circuit includes a delay generation module configurable in two independently selectable and distinct delay resolution regimes.

Another example embodiment provides a circuit that includes a perimeter-gated single-photon avalanche diode. The circuit further includes a hold-off circuit including a set of delay elements forming a delay line in which each delay element includes a first regulator and a second regulator, the first and second regulators being independently selectable. The hold-off circuit is configured to receive, at an inverting section of a leading delay element in the delay line, a signal indicative of an avalanche event in the perimeter-gated single-photon avalanche diode. Furthermore, the delay line is configured to actively delay only one edge of the event signal when one of the first regulator and the second regulator of each delay element in the delay line is selected.

DETAILED DESCRIPTION

Embodiments will be described below in more detail with reference to the accompanying drawings. The following detailed descriptions are provided to assist the reader in gaining a comprehensive understanding of the methods, apparatuses, and/or systems described herein as well as modifications thereof. The described embodiments are not to be construed as limiting the scope of the disclosure. Accordingly, various modifications and equivalents of the methods, apparatuses, and/or systems described herein will be apparent to those of ordinary skill in the relevant art(s). Descriptions of well-known functions and constructions may be omitted for increased clarity and conciseness.

Furthermore, the terms used herein are intended to describe embodiments only and shall by no means be restrictive. Unless clearly used otherwise, expressions in a singular form include a meaning of plural form. An expression such as "comprising" or "including" may be used to designate a characteristic, a number, a step, an operation, an element, a part or combinations thereof, and shall not be construed to preclude the presence or possibility of one or more other characteristics, numbers, steps, operations, elements, parts or combinations thereof.

The embodiments disclosed herein feature readout circuits for single-photon avalanche diodes. Without limitation, the circuit architectures described herein may be adapted, without departing from the scope of the present disclosure, to fit with single-photon avalanche diode arrays in either imager configurations or digital silicon-photomultiplier configurations. Furthermore, without limitation and without departing from the scope of the present disclosure, the circuit architectures described herein may extend to hybridized focal plane arrays or to monolithically integrated focal plane arrays. The various components of example embodiments are described below with respect to FIGS. 1, 2A-2B, and 3-7.

Figure 1:
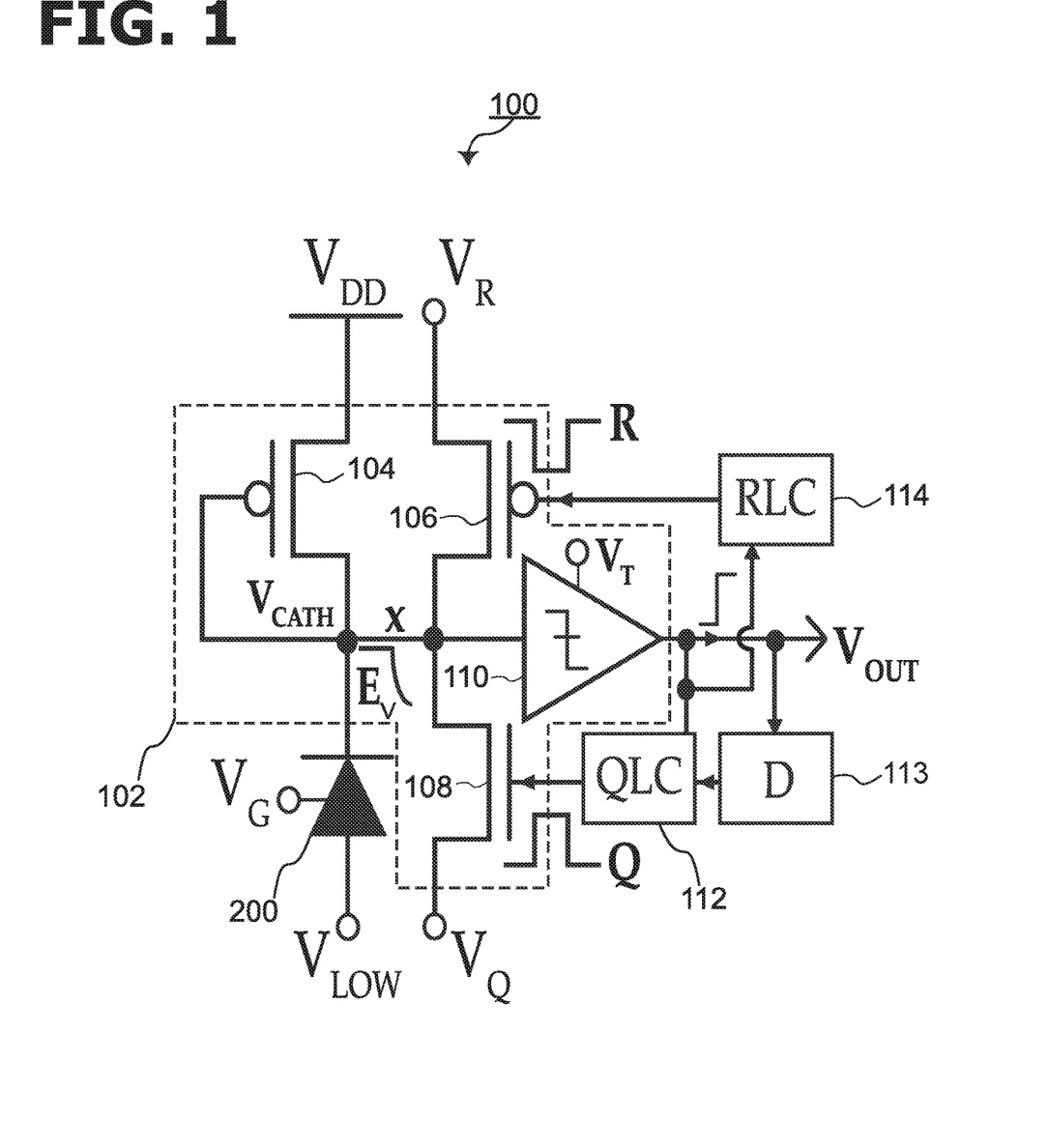
FIG. 1 illustrates a circuit including a single-photon avalanche diode according to various aspects described herein.

FIG. 1 illustrates a circuit 100 that includes a perimeter-gated single-photon avalanche diode (PGSPAD) 200. While the PGSPAD 200 is a single-photon avalanche diode (SPAD) that utilizes a perimeter gate, other SPAD structures are also contemplated and within the scope of the present disclosure. For example and without limitation, other SPAD structures may be p-n junctions that are tapered at the edges, forming mesa structures, or they may be p-n junctions including peripheral diffused guard rings, shallow trench isolations, or retrograde wells, or combinations thereof.

The circuit 100 includes an active quenching and reset (AQAR) circuit 102. The AQAR circuit 102 includes a pFET 106 that is used for resetting the PGSPAD 200 and an nFET 108 that is used for quenching the PGSPAD 200. The AQAR circuit 102 further includes a threshold discriminator 110, which may be, as shown in the example implementation shown in FIG. 1, a Schmitt trigger having a high-to-low switching threshold $V_T$. The AQAR circuit 102 also includes an active load 104 that provides a passive quenching phase, before the nFET 108 is engaged to provide an active quenching phase for the PGSPAD 200, following an avalanche event (denoted Ev in FIG. 1). The leading edge of the signal at the output of Schmitt trigger is indicative of the avalanche event occurring in the PGSPAD 200.

When the pFET 106 is turned on, the voltage at node x is pulled towards $V_{DD}$ (specifically to $V_R$), effectively creating a large applied voltage approximately equal to ($V_{DD}-V_{LOW}$) across the PGSPAD 200 (for $V_R$ close to $V_{DD}$). For Geiger mode operation, the applied voltage must exceed the breakdown voltage of the PGSPAD 200, as well as a latching voltage, greater than the breakdown voltage, at which avalanche currents are sustainable. To reset the PGSPAD 200, the signal R is asserted by a reset logic circuit (RLC) 114 to turn on the pFET 106 at a time coinciding with the end of the quenching phase. Further, the time duration of the reset ($t_{RESET}$) may be adjusted using the RLC 114, as shall be described in further detail below with respect to FIG. 5.

The ability to control the duration of the reset is advantageous because the pFET 106 must remain on for a period of time that is equal to or exceeds the RC time-constant required to pull up node x to $V_R$. If the pFET 106 is turned off too early, the PGSPAD 200 may not be fully reset, and it may thus operate with an efficiency that is different than the efficiency observed in a previous cycle. The controllable reset duration feature also allows for compatibility of the readout circuit (i.e., all the components of the circuit 100 except the PGSPAD 200) with SPADs of different sizes. Such flexibility may be useful when the readout circuit is not monolithically integrated with a SPAD and when it may be interfaced with SPADs that have different effective capacitances when connected to node x.

The PGSPAD 200 is quenched by asserting the signal Q which turns on the nFET 108 and effectively pulls down node x to the quenching voltage $V_Q$. The quenching voltage is chosen so that the applied voltage across the PGSPAD 200 (i.e., $V_Q-V_{LOW}$) is small enough that an avalanche cannot occur. In other words, $V_Q$ may be a voltage below the breakdown voltage of the PGSPAD 200 or a voltage above its breakdown voltage but below its latching voltage. Further, as stated previously, while quenching is mostly achieved using an active component, i.e., the nFET 108, the initial quenching phase is passive, and it is provided by the resistance of the active load 104, which is a diode-connected pFET. In other implementations, the active load 104 may be substituted with a passive load. In yet other implementations, the active load 104 may be part of a current mirror. In these alternate implementations, the active load 104 serves as an interface for mirroring and sampling the avalanche current through the PGSPAD 200 without interfering with the mixed-signal readout chain provided by the other components of the readout circuit.

The PGSPAD 200 may be held in a quenched state for a predetermined amount time, i.e. for the duration of a hold-off time denoted tHOLDOFF in the timing diagram 170 of FIG. 5 and discussed in greater detail below. Holding the PGSPAD 200 in the quenched state ensures that carriers trapped during an avalanche do not trigger additional avalanche events. These carriers are not related to photon arrival in the junction but are rather a byproduct of the avalanche process; this phenomenon is termed "afterpulsing." Therefore, holding the junction in the quenched state for a time tHOLDOFF that exceeds the trapped carrier lifetime contributes in reducing the dark count rate by eliminating its afterpulsing component.

A hold-off circuit that includes a quenching logic circuit (QLC) 112, the delay module 113, and the quenching transistor 108, is used to generate $t_{HOLDOFF}$. The QLC 112 may be programmed to force the voltage at node x at $V_Q$ for a time period equal to $t_{HOLDOFF}$. The hold-off time may be generated when a delay module 113 is triggered by the leading edge of a digital pulse produced by the Schmitt trigger coupled to node x, i.e., by the digital signal obtained at the output of the threshold discriminator 110 in response to the event signal Ev. Once the voltage at node x falls below a predetermined threshold $V_T$ of the Schmitt trigger, the quenching signal Q is asserted and the delay module 113 is engaged.

Figure 2A:
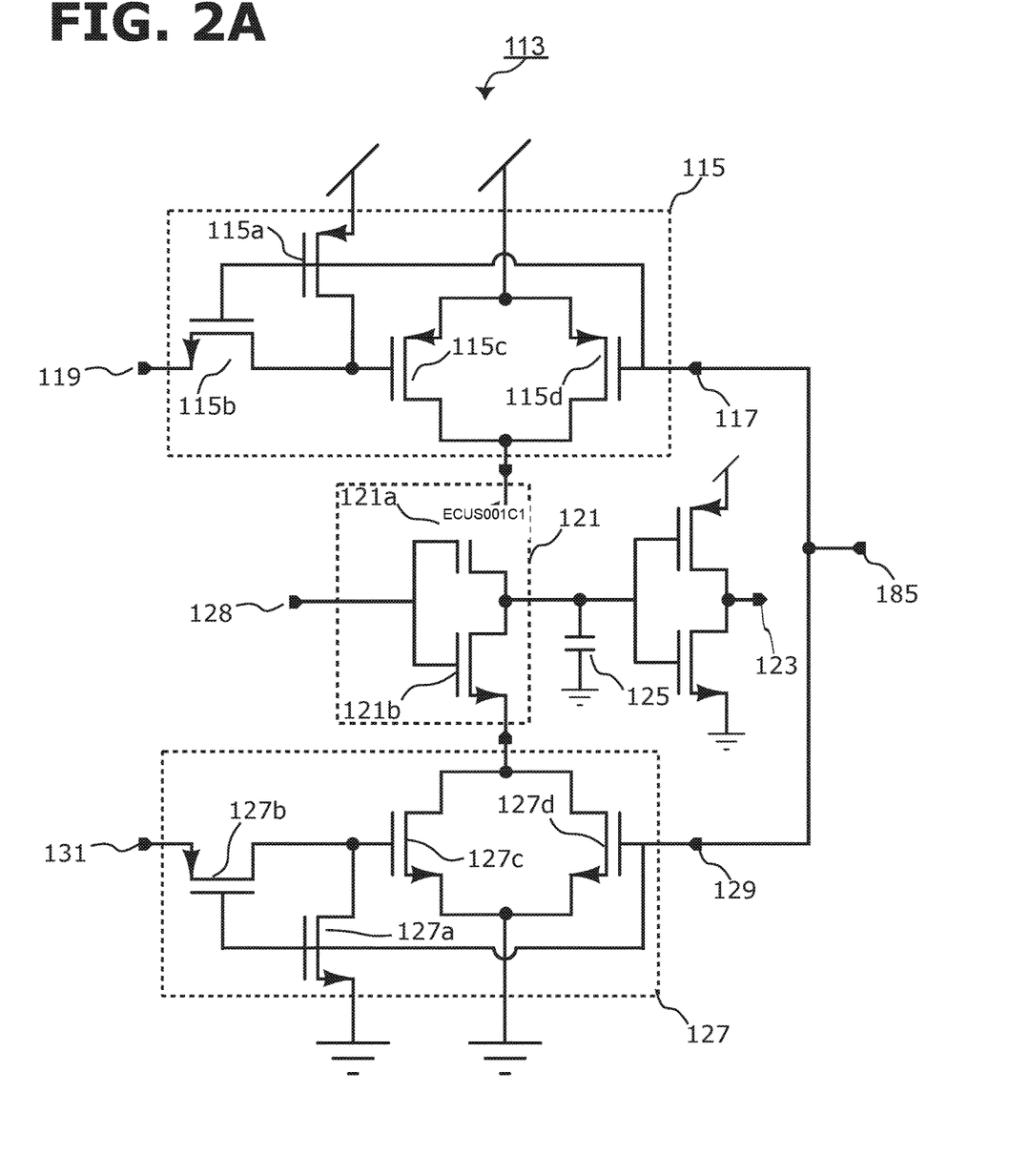
FIG. 2A illustrates a delay element according to various aspects described herein.

In one embodiment, the delay module 113 may be a single delay element shown in FIG. 2A. The delay element includes a capacitor 125 disposed at the output node of an inverting section 121. The capacitor 125 may be an explicit capacitor or it may be the parasitic or intrinsic capacitance at the output node of the inverting section 121. The delay element further includes a second inverting stage that boosts and inverts the voltage across the capacitor 125 and outputs (at the output port 123) a delayed version of the input signal placed on the input port 128.

The delay element includes a first regulator 115 and a second regulator 127, each of which is independently selectable via a selection terminal 185 that is commonly shared between the first regulator 115 and the second regulator 127. Stated otherwise, the first regulator 115 and the second regulator 127 may be turned on alternately, i.e., interchangeably. For example, when the first regulator 115 is turned on the second regulator 127 is turned off, and vice versa.

The selection terminal 185 may be energized using a digital signal which, depending on its logic level, turns one of the regulators on while leaving the other one off. For example, when a logic 1 signal is applied to the selection terminal 185, the first regulator 115 is turned on and the second regulator 127 is turned off. Specifically, in the first regulator 115, the digital input port 117, i.e., the gate of the transistor 115d sees a logic 1 voltage (i.e., $V_{DD}$). Thus, the transistors 115d and 115a are turned off, while the transistor 115b is turned on. An analog voltage is placed on an analog input port 119 of the transistor 115b; the analog voltage serves to regulate the current in the inverting section 121 via the regulator transistor 115c.

Moreover, when the signal on the selection terminal 185 is at logic 1, the digital input port 129 of the second regulator 127 also sees the logic 1 signal. The transistor 127d is turned on, thus pulling the source of the transistor 121b in the inverting section 128 down to ground. The transistors 127b is turned off while the transistor 127a is turned on to effectively pull the gate of the of the regulator transistor 127c down to ground, effectively turning it off. As such, no current regulation occurs in the second regulator 127 when a logic 1 signal is placed on the selection terminal 185.

The opposite situation occurs when a logic 0 signal (i.e., gnd) is placed on the selection terminal 185; the first regulator 115 is turned off and the second regulator 127 is turned on. At logic 0, in the first regulator 115, the transistor 115d is turned on and it pulls the source of the transistor 121a in the inverting section 121 to $V_{DD}$. The regulator transistor 115c is turned off as its gate is pulled towards $V_{DD}$ by the transistor 115a. The transistor 115b is also turned off. Therefore, no current regulation occurs in the first regulator 115 when the selection terminal 185 is energized with a logic 0 signal.

In the second regulator 127, the transistors 127a and 127b are turned off when a logic 0 signal is applied on the selection terminal 185. However, the logic 0 signal turns on the transistor 127b, allowing the regulator transistor 127c to regulate the current in the output branch of the inverting section 121 based on an analog voltage placed on the analog input port 131 of the transistor 127b.

Figure 2B:
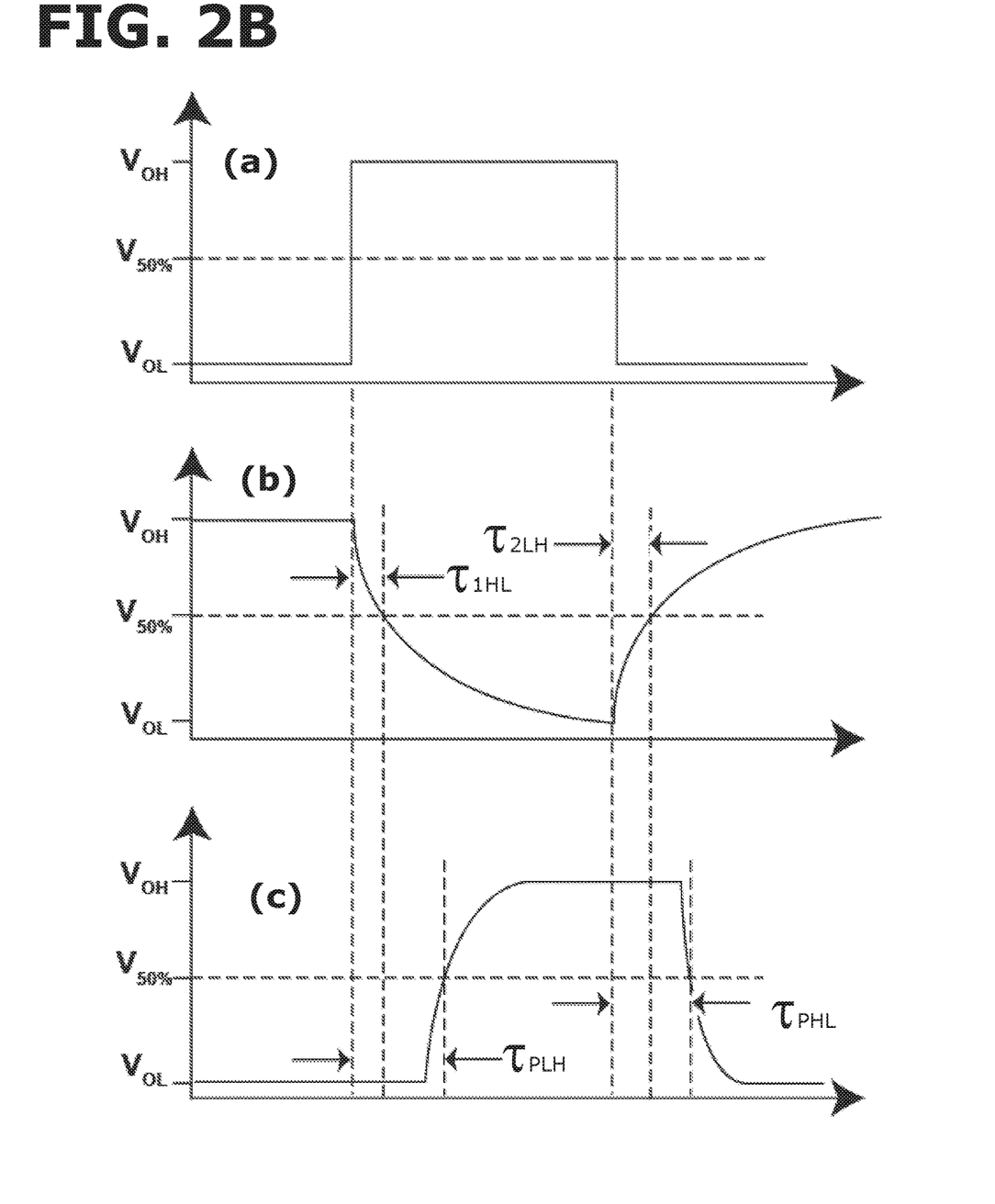
FIG. 2B illustrates a convention used to estimate delay times according to various aspects described herein.

For the purpose of demonstrating the delay regimes in which the delay element of FIG. 2A may be programmed, a convention used to estimate various delay times is described with respect to FIG. 2B. An input voltage signal, e.g., an input voltage at the input port 128 of the delay element, is modeled as an idealized digital signal shown in panel (a) of FIG. 2B. The idealized digital signal has zero rise time and zero fall time. The output voltage at the output node of the first stage of the delay element, i.e., at the output node of inverting section 121, particularly across the capacitor 125, is shown in panel (b).

The propagation delay times $\tau_{1HL}$ and $\tau_{2LH}$ are the input-to-output signal delay during high-to-low and low-to-high transitions through the inverting section 121 (see panel (b)); the total delay time through this stage is denoted $\tau_{p1}$ (Equation 1). The overall propagation through the delay element, i.e., the delay between the input terminal 128 and the output terminal 123, denoted $\tau_{pf}$, is defined as the delay through the first stage, i.e., through the inverting section 121, added to the delay of the second inverting section of the delay element. This is expressed mathematically in Equation 2.

$$\tau_{p1} = \frac{\tau_{1HL} + \tau_{2LH}}{2} \quad (1)$$

$$\tau_{pf} = \tau_{p1} + \tau_{inv} \quad (2)$$

$$\tau_{inv} = \frac{C_{OUT}}{2k_n(V_{DD} - V_{tn})}\left[\frac{2V_{tn}}{(V_{DD} - V_{tn})} + \ln\left(\frac{4(V_{DD} - V_{tn})}{V_{DD}} - 1\right)\right] + \frac{C_{OUT}}{2k_p(V_{DD} - |V_{tp}|)} + \left[\frac{2|V_{tp}|}{(V_{DD} - |V_{tp}|)} + \ln\left(\frac{4(V_{DD} - |V_{tp}|)}{V_{DD}} - 1\right)\right] \quad (3)$$

It should be noted that while the delay through the inverting section 121 depends on the regime of operation, i.e., on which logic signal is applied to the selection terminal 185 and on one of the analog voltages, the second stage delay is constant since it is that of a digital inverter. The delay time through the second inverting section is thus static, and it is shown in Equation 3, where $C_{OUT}$ is the capacitance at the output port 123, Vtn and Vtp the respective threshold voltages of the nFET and pFET transistors, and kp and kn are parameters that depend on the fabrication process and the aspect ratios of the transistors.

When the signal on the selection terminal 185 is at logic 1, the inverting section 121 becomes an unbalanced current-starved inverter. This means that for only one of the digital transitions of the input signal on the input port 128, specifically for the low-to-high transition, will the output current of the inverting section 121 be regulated, i.e., controlled using the analog voltage on the analog input port 119. However, in the high-to-low transition, since the transistor 121a is off and the second regulator 127 is deactivated, the input signal is passively delayed through both the inverting section 121 and the second inverting section., i.e., it is delayed with no regulation using an analog voltage.

As such, in the regime corresponding to logic 1 on the selection terminal 185, the current into the capacitor 125 is regulated only in the first regulator 115 and by the regulator transistor 115c. As a result, for only the low-to-high transition ($\tau_{PLH}$ in panel (c)) of the input signal at the input port 128 may the delay element actively control the output current. In other words, the analog voltage on the input port 119 can be varied to modulate the delay in the low-to-high transition of the input signal but it (the analog voltage) has no effect on the delay in high-to-low transition of the input signal ($\tau_{PHL}$ in panel (c)).

$$\tau_{pf} = \frac{C_{OUT}}{2k_n(V_{DD} - V_{tn})}\left[\frac{2V_{tn}}{(V_{DD} - V_{tn})} + \ln\left(\frac{4(V_{DD} - V_{tn})}{V_{DD}} - 1\right)\right] + \frac{C_L V_{DD}}{2k_{pM1}(VBP - V_{DD} - |V_{tp}|)^2} + \tau_{inv} \quad (4)$$

The total delay for the regime corresponding to logic 1 on the selection terminal 185 is shown in Equation 4. The first term in the sum represents the propagation delay of the high-to-low transition, which is independent of any analog control voltage; the second term in the sum represents the delay in the low-to-high transition, which depends on the analog voltage $V_{BP}$, i.e., the analog voltage on the input port 119. (The parameter $k_{pM1}$ is the transistor parameter for the regulator transistor 115c and $C_L$ is the load capacitance at the inverting section 121. Lastly, the third term in the sum ($\tau_{inv}$)

is the passive delay (Equation 3) provided to both transitions by the second inverting section of the delay element.

In conclusion, from Equation 4, it can be seen that the total delay achievable in this regime is a function of $V_{BP}$, since all the other values are constants, and that the total delay is exclusively obtained from delaying the low-to-high transition of the input signal.

Figure 3:
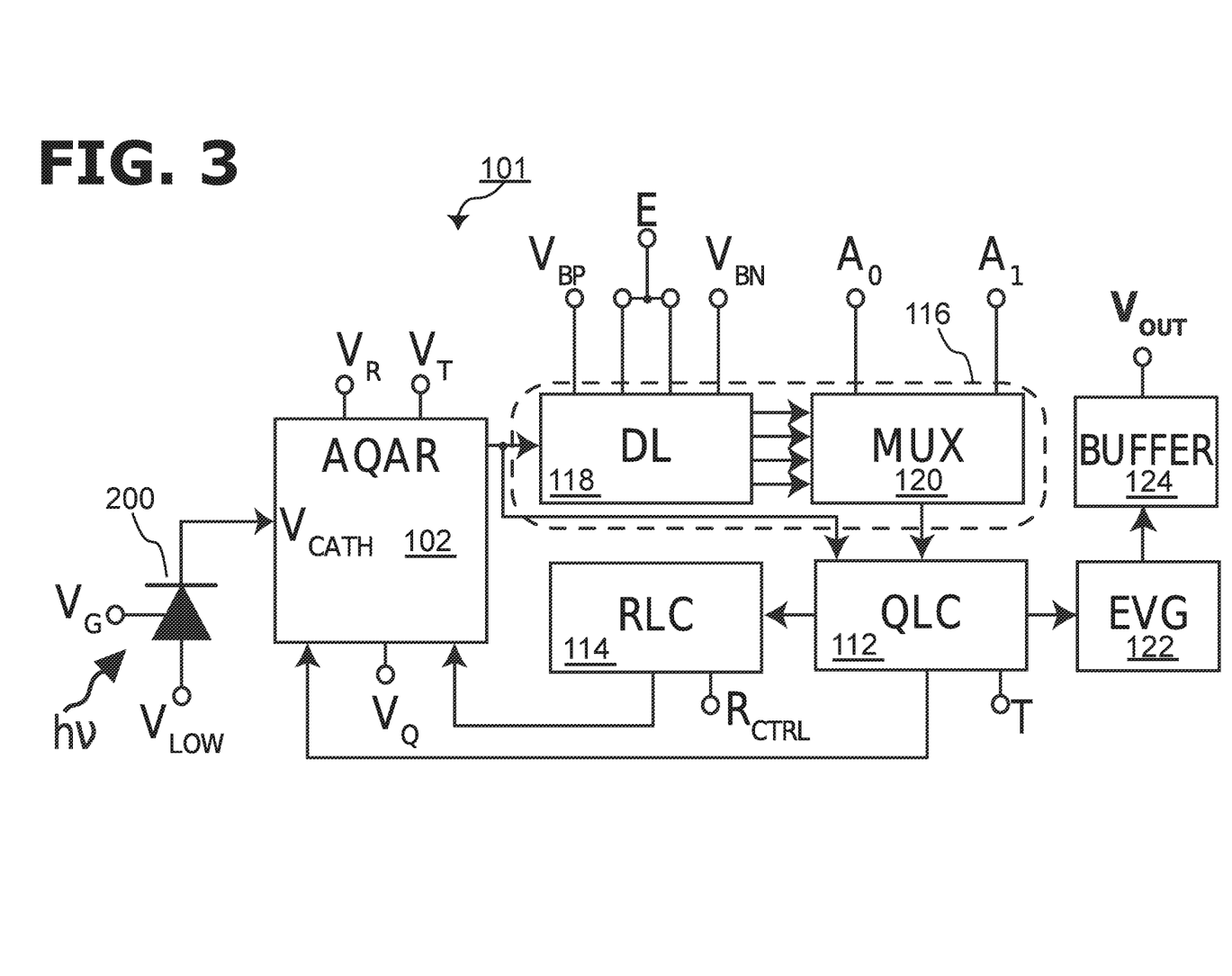
FIG. 3 illustrates a circuit including a single-photon avalanche diode according to various aspects described herein.

The delay element of FIG. 3 may be programmed in a delay regime distinct from the one described above, where only the high-to-low transition in the input signal is actively delayed. This may be achieved by energizing the selection terminal 185 with a logic 0 signal. The analysis for this regime is similar to the previous discussion for the logic 1 case. In the logic 0 case, however, the first regulator 115 is deactivated and the second regular 127 is turned on. The output current of the inverting section 121 is thus regulated by the transistor 127c based on the analog voltage on the analog input port 131. As such, only the high-to-low transition ($\tau_{PHL}$) in the input signal on the input port 128 is actively delayed whereas the low-to-high transition is passively delayed.

$$\tau_{pf} = \frac{C_L V_{DD}}{2k_{nQ1}(VBN - V_{tn})^2} + \frac{C_L}{2k_{M0}(V_{DD} - |V_{tp}|)} \left[ \frac{2|V_{tp}|}{(V_{DD} - |V_{tp}|)} + \ln\left(\frac{4(V_{DD} - |V_{tp}|)}{V_{DD}} - 1\right) \right] + \tau_{inv} \quad (5)$$

The total delay in the regime corresponding to logic 0 is given by Equation 5. The first term in the sum represents the propagation delay of the high-to-low transition, which depends on the analog voltage $V_{BN}$, i.e., the analog voltage on the input port 131. The second term in the sum represents the delay in the low-to-high transition which is independent of any analog control voltage; (The parameter $k_{nQ1}$ is the transistor parameter for the regulator transistor 127c and $C_L$ is the load capacitance at the inverting section 121. Lastly, the third term in the sum ($\tau_{inv}$) is the passive delay (Equation 3) provided to both transitions by the second inverting section of the delay element. In conclusion, from Equation 5, it can be seen that the total delay achievable in this regime is a function of $V_{BN}$, since all the other values are constants, and that the total delay is exclusively obtained from delaying the high-to-low transition of the input signal.

In one embodiment, the delay element of FIG. 3 may be configured to provide two distinct delay resolution regimes. Specifically, when the regulator transistors 115c and 127c are asymmetrically sized, i.e., when one's aspect ratio is larger (or smaller) than that of the other, regulating the output current with the respective analog control voltage of each regulator of the delay element yields different delay resolutions.

The resolution may be defined herein as a ratio of the change in an analog control voltage in volts (V) to the resulting delay in seconds (s). As can be seen in Equations 4 and 5, when $k_{pM1}$ and $k_{nQ1}$ are not equal, i.e., when the regulator transistors 115c and 127c are asymmetrically sized, the same change in either analog voltage $V_{BP}$ and $V_{BN}$ yields different amounts of total delay ($\tau_{pf}$). In this embodiment, the total delay may thus be provided in a coarse control regime, where the delay increases rapidly with the analog control voltage of one regulator, or in a fine control regime, where the delay increases slowly with the analog control voltage of the other regulator.

Figure 4:
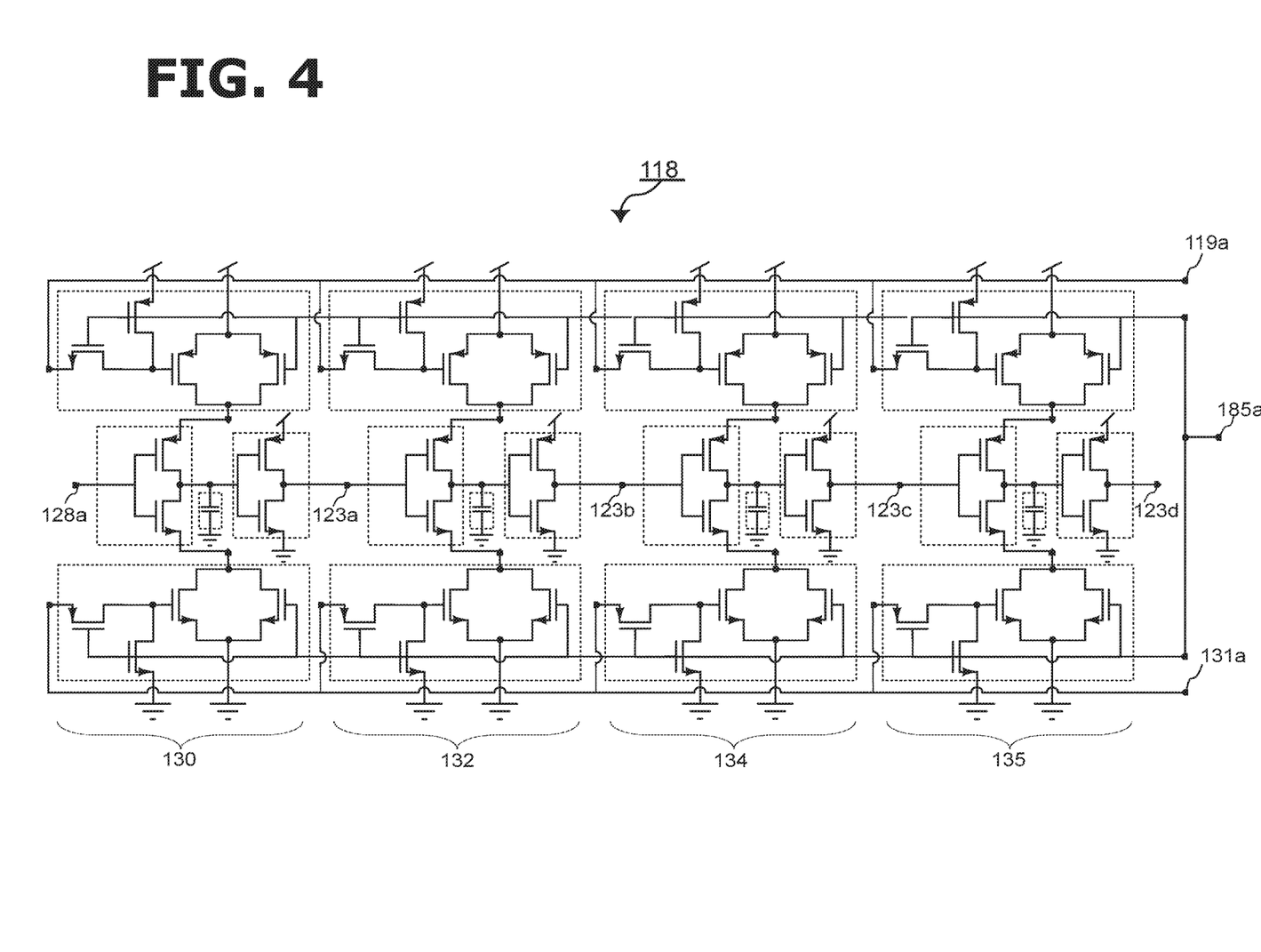
FIG. 4 illustrates a delay line according to various aspects described herein.

FIG. 3 illustrates a circuit 101 where the delay module 113 is implemented using a delay line 118 and a multiplexer 120, i.e., with a multiplexed delay line 116. As shown in FIG. 4, the delay line 118 includes a set of delay elements (130, 132, 134, and 135) like the delay element shown in FIG. 3. While the example disclosed herein features four delay elements in the line 118 and 2-to-4 multiplexer, longer delay lines and correspondingly more complex multiplexers may be used without departing from the scope of the teachings featured in the present disclosure.

As depicted in FIG. 4, the delay elements 130, 132, 134, and 135 are cascaded in series and the signal at node x in the AQAR circuit 102 (see FIG. 1) is fed to the input port 128a of the leading delay element (130) in the series. The signal at the input port 128a is successively delayed through the following delay elements (132, 134, and 135), and its version having the maximum total delay is outputted at the output port 123d.

Further, any one of two possible delay regimes may be selected, and delaying of only one edge of the input signal at the input port 128a may be achieved using an analog voltage placed on either one of ports 119a and 131a. In other words, in the set of delay elements making up the delay line 118, the first regulator of each delay element may be on while the second regulator of each delay element is off, or vice versa.

Moreover, turning back to FIG. 3, utilizing the multiplexer 120, via its control bits A0 an A1, any one of the outputs 123a, 123b, 123c, and 123d may be used as the output of the delay line 118. As such, in addition to being able to select one of two possible delay regimes based on a digital signal on the selection terminal 185a, the multiplexed delay line 116 provides additional granularity in delay generation and thus in hold-off time generation. Furthermore, in the delay line 118, any one delay element may have its regulator transistors asymmetrically sized in order to provide two distinct delay resolution regimes, as discussed above with respect to FIG. 3.

In the circuit 101, a hold-off circuit can include the multiplexed delay line 116, the QLC 112, and the quenching transistor 108 of the AQAR circuit 102. The QLC 112, whether for the circuit 100 or the circuit 101, may include a combinatorial circuit that may be synthesized using any commonly used gate logic families, based on the input and output characteristics of the QLC 112, which are now provided below.

The QLC 112 may include a combinatorial circuit that take as its input the signal indicative of an avalanche event in the PGSPAD 200, i.e., the signal at the output of the threshold discriminator 110 in the AQAR circuit 102. The QLC 112 may also takes as its input, the delayed version of the event signal, which is obtained at the output of a single delay element (circuit 100) or at the output of a multiplexed delay line (circuit 101). The QLC 112, may then use the threshold discriminator 110 output to trigger a flip-flop, for example, in order to assert the quenching signal Q. As such, the quenching signal is asserted as soon as the threshold discriminator 110 outputs a signal (as shall be described in further detail below). The quenching signal Q remains asserted until the hold-off period expires.

Expiry of the hold-off period is determined by the delayed version of the input signal outputted by the delay element (circuit 100) or by the multiplexed delay line (circuit 101). The quenching signal Q may be de-asserted on the high-to-low transition of the delayed version of the input signal, when the delay generation module (113 or 116) is programed in a regime where the high-to-low transition is the only edge that is delayed. Alternatively, the quenching signal may be de-asserted on the low-to-high transition of the delayed version of the input signal when the delay generation module (113 or 116) is programmed in a regime where the low-to-high transition is the only edge that is delayed. Furthermore, the QLC 112 may include a toggle input T that serves to bypass the hold-off feature, thereby allowing the circuit 101 to operate without holding the PGSPAD 200 in a quenched state. In other words, the PGSPAD 200 may be reset immediately after being quenched, thereby operating in a free-running mode, as explained above.

Similarly, the RLC 114 may be synthesized based on its input/output characteristics. The RLC 114 is triggered when the quenching signal Q is de-asserted. As such, the RLC 114 may be triggered on the high-to-low transition of the quenching signal Q, which it takes as an input. Once triggered, the RLC 114 asserts the reset signal R in order to turn on the reset transistor 106, which then pulls the node x back towards $V_{DD}$ from $V_Q$. The reset signal duration may be actively controlled using a delay element (not shown) based on a control voltage $R_{CTRL}$. One of skill in the art will readily recognize, based on the functionalities and input/output characteristics described above, that the QLC 112 and the RLC 114 may be synthesized using digital logic gates and standard memory elements, such as latches and or flip-flops.

The event generator 122 may be a pulsing circuit that is edge-triggered based on the signal from the threshold discriminator 110 or on the rising edge of the quenching signal. The output of the event generator 122 may be buffered via a digital buffer 124 to produce an output signal $V_{OUT}$. As shall be described below, only the leading edge of the $V_{OUT}$ signal matters, as it corresponds to the time of arrival of a photon in the junction of the PGSPAD 200.

Figure 5:
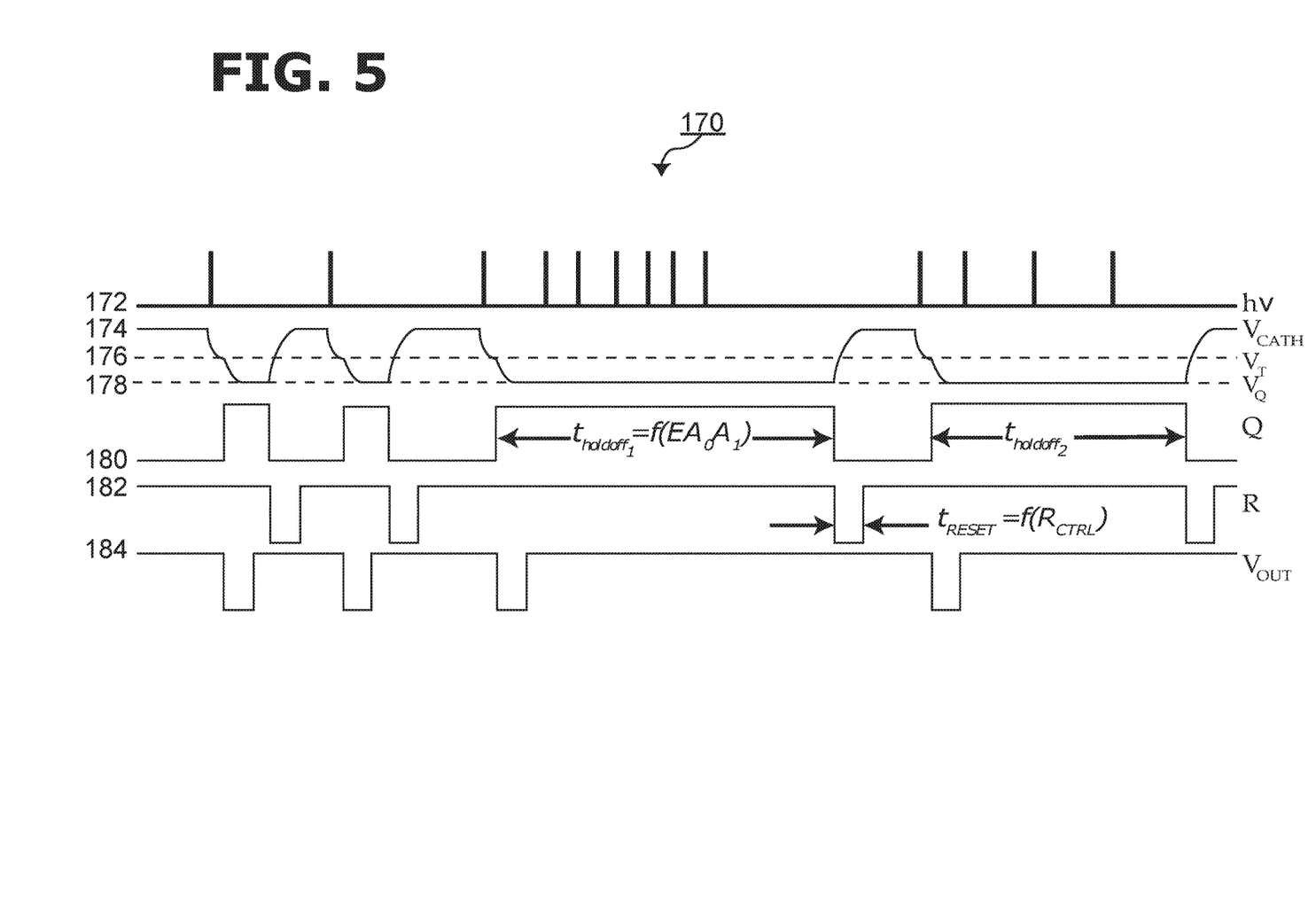
FIG. 5 illustrates a timing diagram associated with the operation of a circuit including a single-photon avalanche diode, according to various aspects described herein.

FIG. 5 illustrates various traces that may be observed during a typical operation of either the circuit 100 or the circuit 101. As such, the timing diagram 170 is merely an example, and is by no means a limiting description of either circuit's operation.

The trace 172 is a delta function train that represents the arrival of photons having energy hv. When a photon impinges on the PGSPAD 200, assuming that the circuit is at quiescence, an avalanche event will occur. As shown in the trace 174, and with respect to the first delta function starting from the left on the trace 172, the voltage at node x, i.e., $V_{CATH}$, falls exponentially (as a result of the initial passive quenching phase provided by the active load 104). When the voltage at node x crosses the $V_T$ threshold (line 176), the quenching signal Q (trace 180) is asserted by the QLC 112, and the node x is pulled towards $V_Q$ (line 178). In a free-running mode, the quenching signal is de-asserted after an intrinsic time and the reset signal R (trace 182) is asserted by the RLC 114 on the falling edge of the quenching signal Q. The PGSPAD 200 is thus reset, i.e., its cathode is pulled back towards $V_R$, and the PGSPAD 200 is ready for detecting another avalanche event.

Now, with respect to the third delta function from the left, the circuit 101 or 100 may not be running in the free-running mode. As such, the same cycle described above occurs, but instead of being reset right after quenching, the quenching signal Q remains asserted for a time tHOLDOFF1 that depends on the logic signal E, and the control bits $A_0$ and $A_1$ of the multiplexer 120, for example. When the PGSPAD 200 is held off, photons arriving during that time are not registered since the PGSPAD 200 is quenched. The reset signal R is then asserted on the falling edge of the quenching signal Q, i.e., when the hold-off time tHOLDOFF1 expires. As mentioned above, the duration $t_{RESET}$, i.e., the time constant of the reset can be controlled based on an analog control voltage $R_{CTRL}$.

Lastly, with respect to the tenth delta function on the trace 172, the hold-off circuit may be programmed to yield a hold-off time $t_{HOLDOFF2}$ that is different than $t_{HOLDOFF1}$. This may be achieved, in the various manners described above, with respect to the circuits 100 and 101, e.g., either by changing the delay regime or multiplexing a different output of the delay line 118. The trace 184 represents the output signal $V_{OUT}$, and only its leading edge is useful, since it corresponds with the photon arrival time. For example, as shown in the timing diagram 170, the leading edges of the pulses on the trace 184 correspond in time with the delta functions on the trace 172.

Figure 6:
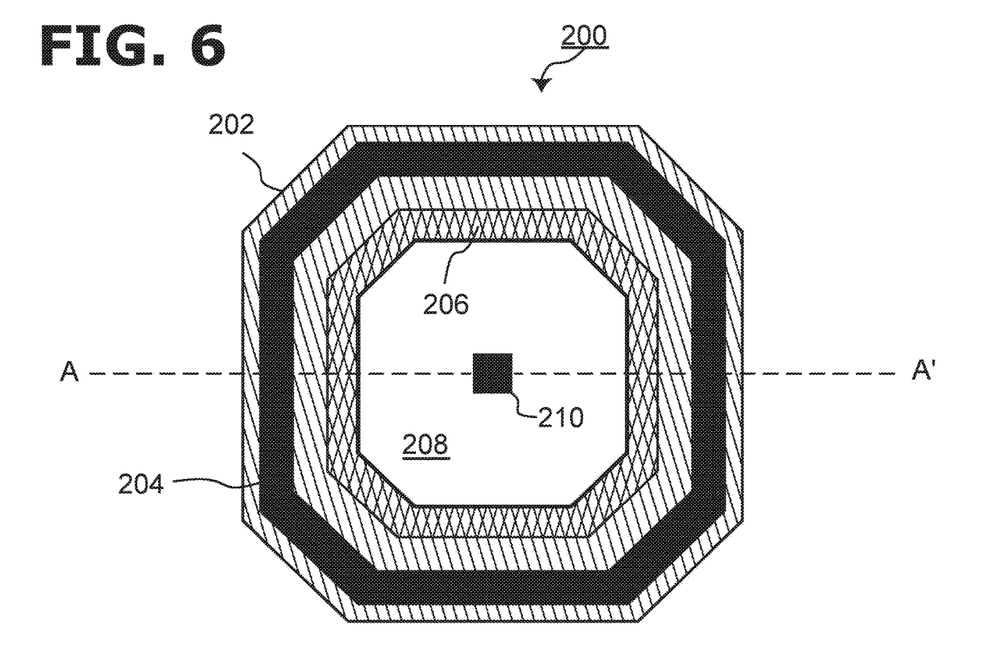
FIG. 6 illustrates a top view of a single-photon avalanche diode structure according to various aspects described herein.

FIG. 6 illustrates a top view (as it would show in layout) of the PGSPAD 200. The PGSPAD 200, as shown in FIG. 6, forms a p+/n-well junction that may be fabricated in a semiconductor layer such as silicon. For example, and without limitation, the PGSPAD 200 may be fabricated in complementary metal-oxide semiconductor (CMOS) process utilizing the p+ and n-well implant options available in the process. In some embodiments, the PGSPAD 200 may be an n+/p-well junction or an n+/p-sub junction.

The PGSPAD 200 includes an n-well 202 and an n-well contact 204 in the form of a ring disposed within and at the periphery of the n-well 202. The n-well contact 204 may be an n+ implant that may be contacted with a set of vias, thus providing the n-well 202 connectivity to metallic layers. The PGSPAD 200 further includes a perimeter gate 206 disposed within the n-well 202. The perimeter gate 206 may be made of poly-silicon or with a metal.

The PGSPAD 200 also includes a p+ implant 208 that is centrally located relative to the n-well 202. The n-well 202 and the p+ implant 208 thus form a p-n junction. In laying out the PGSPAD 200 for fabrication in a CMOS process, the perimeter gate 206 may be drawn so as to straddle the edge of the p+ implant 208. However, when fabricated, since in CMOS processes no active region is placed under poly-silicon layers, the edge of the perimeter gate abuts the p+ implant 208, as shown in the cross-sectional view depicted in FIG. 7. The p+ implant 208 is contacted using a p+ implant contact 210, which may be disposed in the middle of the device (as shown in FIG. 6), or it may be in the form of a contact ring located at the periphery of the p+ implant 208, similarly to the n-well contact 204.

Figure 7:
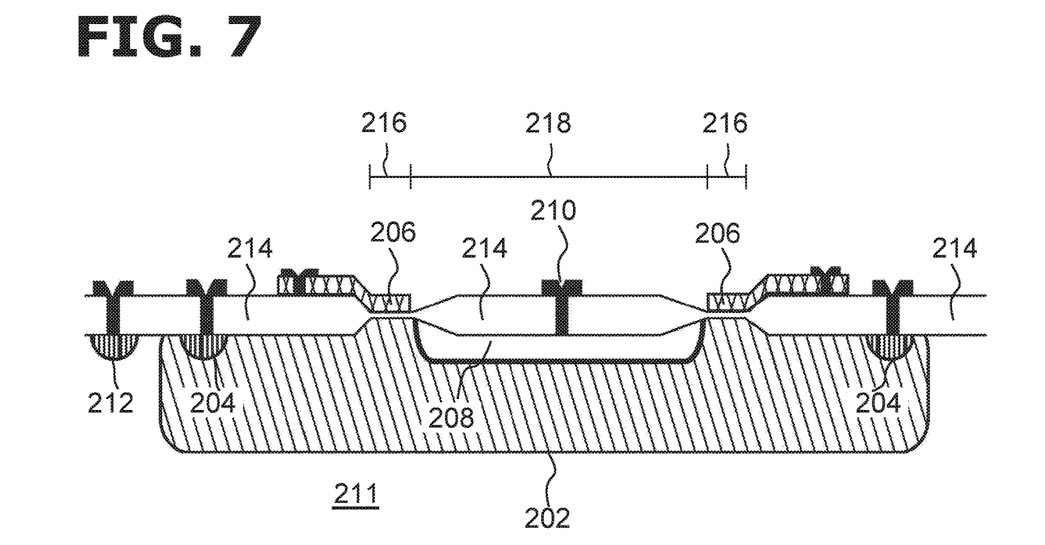
FIG. 7 illustrates a cross-sectional view of a single-photon avalanche diode according to various aspects described herein.

FIG. 7 shows a cross-sectional view of the PGSPAD 200 across an axisymmetric line AA'. The cross-sectional view shows an implementation of the PGSPAD 200 in a CMOS process. The substrate 211 is a p-type region that may be a p-doped epitaxial layer, a p-doped bulk silicon layer, or a p-well. The substrate 211 is contacted using a p+ implant 212. During operation, the substrate 211 is held at ground and the n-well 202 is held at $V_{DD}$ (e.g., either at 5V or at 3.3V, for some CMOS processes); the substrate 211 and the n-well 202 thus form a reversed-bias p-n junction. The PGSPAD 200 may be passivated using an oxide 214. The oxide 214, in the regions 216 where the perimeter gate 206 (as drawn) straddles the p+implant 208, includes a gate oxide. In one example, the regions 216 may each be shorter than 0.5 μm. The active area of the PGSPAD 200, i.e., the area where light impinges on the diode, is the region 218.

One of skill in the art will readily recognize that the various constitutive layers of the PGSPAD 200 are not drawn to scale. Further, one of skill in the art will readily recognize that the plus sign with respect to a region is generally used to indicate a region having a higher concentration of a particular type of dopant relative to another region in which the plus sign is not used as an identifier. For example, it is to be understood that a p+ region, in the context of FIG. 6 and FIG. 7, indicates a region that has a higher concentration of p-dopants than a region indicated as a p region.

Generally, one embodiment based on the teachings presented herein may be a circuit that includes a single-photon avalanche diode. The circuit may be made of discrete components or it may be an integrated circuit fabricated in at least one semiconductor wafer. Specifically, in the latter case, the integrated circuit may include at least two semiconductor layers that are hybridized to provide one or more (or all) of the circuit functionalities described herein. For example, and without limitation, the single-photon avalanche diode may be fabricated in a germanium layer that may be hybridized on a silicon layer including readout circuit elements.

The circuit may include, in a readout chain, a delay element that includes a first regulator and a second regulator, each of which is independently selectable based on a selection signal applied to a selection terminal of the delay element. In other words, the first regulator may be turned on while the second regulator may be turned off, or vice versa.

The delay element may be configured to receive, at an inverting section, an event signal indicative of an avalanche event in the single-photon avalanche diode. Furthermore, the delay element may be configurable, i.e., it may be programmed, in at least one of two distinct delay resolution regimes.

Each delay resolution regime may correspond to only one edge of the event signal being actively delayed by the delay element when one of the first regulator and the second regulator is selected. As noted above, one regime may be a fine delay tuning regime whereas the other regime may be a coarse delay tuning regime.

The delay element may further include a quenching circuit configured to hold the single-photon avalanche diode in a quenched state for the duration of a time period during which the only one edge is actively delayed. As noted above, a quenched state may be a state in which the voltage across the single-photon avalanche diode is below the latching voltage threshold, i.e., below the voltage at which an avalanche current is sustainable in the junction of the single-photon avalanche diode. The quenching circuit may include a combinatorial logic circuit, as described above, and a quenching transistor.

The reset circuit may be configured to reset the single-photon avalanche diode when a time period during which the only one edge is actively delayed expires. In other words, at the expiry of the time period, the reset circuit may bring the voltage across the single-photon avalanche diode above the latching voltage threshold, i.e., above the voltage at which an avalanche current is sustainable in the junction. The reset circuit may include a combinatorial logic circuit, as described above, and a reset transistor.

In the exemplary circuit described above, the first regulator may include a first digital voltage input port and a first analog voltage control port, and the second regulator may include a second digital voltage input port and a second analog voltage control port. The first regulator may be configured to actively delay only a low-to-high transition of the event signal, based on an analog voltage applied to the first analog voltage control port, and when a digital voltage is applied to the first and second digital voltage input ports. Furthermore, the second regulator is configured to actively delay only a high-to-low transition of the event signal, based on another analog voltage applied to the second analog voltage control port, when a complement of the digital voltage is applied to the first and second digital voltage input ports.

Another embodiment based on the teachings provided herein may be a circuit that includes a perimeter-gated single-photon avalanche diode and a hold-off circuit. The hold-off circuit may be configured to quench the perimeter-gated single-photon avalanche diode for a fixed amount of time. Further, the hold-off circuit may include a delay generation module configurable, i.e., programmable, in two independently selectable and distinct delay resolution regimes.

The hold-off circuit may include a set of variable delay elements, and each variable delay element may be a voltage-controlled variable delay element. Furthermore, a variable delay element in the set of variable delay elements may include a first regulator and a second regulator. The first regulator may include a first regulator transistor that is asymmetrically sized relative to a second regulator transistor included in the second regulator.

The set of variable delay elements may be a multiplexed set of variable delay elements. In other words, the set of variable delay element may include a multiplexer and a delay line formed with the variable delay elements. The multiplexer may then be programmed to output a delayed signal at a specific point in the delay line, thus providing the ability to obtain a specific delay time, and hence a specific hold-off time.

The circuit may include a quenching circuit and a reset circuit. The quenching circuit may be coupled to the hold-off circuit, and the quenching circuit may be configured to hold the single-photon avalanche diode in a quenched state during the fixed amount of time. On the other hand, the reset circuit may be coupled to the quenching circuit, and the reset circuit may be configured to raise an applied voltage across the single-photon avalanche diode when the quenching circuit is disengaged, i.e., when the hold-off time provided by the hold-off circuit expires.

Another embodiment based on the teachings presented herein may be a circuit that includes a perimeter-gated single-photon avalanche diode and a hold-off circuit including a set of delay elements forming a delay line. In the delay line, at least one delay element may include a first regulator and a second regulator, and the first and second regulators may be independently selectable.

The hold-off circuit may be configured to receive, at an inverting section of a leading delay element in the delay line, an event signal indicative of an avalanche event in the perimeter-gated single-photon avalanche diode, and wherein the delay line is configured to actively delay only one edge of the event signal when one of the first regulator and the second regulator of each delay element in the delay line is selected.

The delay line may be programmable in one of two distinct delay resolution regimes. In the circuit described above, in a specified delay element included in the set of delay elements, the first regulator may include an asymmetrically sized first regulator transistor relative to a second regulator transistor included in the second regulator. Further, the delay line may be a multiplexed delay line. Moreover, the hold-off circuit may include a selection terminal configured to only enable, i.e., to turn on while leaving the other regulator off, either the first regulator of each delay element in the set or the second regulator of each delay element in the set.

Although the drawings describe operations in a specific order and/or show specific arrangements of components and are described in the context of a circuit including a single-photon avalanche diode, one should not interpret that such specific order and/or arrangements limit the scope of the present disclosure, or that all the operations performed and the components disclosed are needed to obtain a desired result.

What is claimed is:

1. A delay circuit, comprising:
   a first regulator configured to cause only a first edge of an input signal to the delay circuit to be actively delayed by the delay circuit, wherein a second edge of the input signal is not actively delayed when the first regulator is enabled;
   a second regulator configured to cause only the second edge of the input signal to be actively delayed by the delay circuit, wherein the first edge of the input signal is not actively delayed when the second regulator is enabled; and
   a selection terminal, which when energized with a digital voltage, enables one of the first regulator and the second regulator and disables the other one of the first regulator and the second regulator.

2. The delay circuit of claim 1, wherein the first regulator includes a regulator transistor controllable using an analog voltage, the analog voltage configured to vary an amount of delay applied to the first edge.

3. The delay circuit of claim 1, wherein the second regulator includes a regulator transistor controllable using an analog voltage, the analog voltage configured to vary an amount delay applied to the second edge.

4. The delay circuit of claim 1, further comprising a first inverting section and a second inverting section, the input signal being applied at an input port of the first inverting section, and wherein the second inverting section is configured to produce an output signal at an output port of the second inverting section, the output signal being a delayed version of the input signal.

5. The delay circuit of claim 4, further comprising a capacitor disposed between the first inverting section and the second inverting section.

6. The delay circuit of claim 5, wherein the capacitor is an explicit capacitor.

7. The delay circuit of claim 5, wherein the capacitor is a parasitic capacitor.

8. The delay circuit of claim 1, wherein the first edge is high-to-low transition in the input signal.

9. The delay circuit of claim 1, wherein the second edge is a low-to-high transition in the input signal.

10. The delay circuit of claim 1, wherein the first regulator includes a first regulator transistor and the second regulator includes a second regulator transistor, and wherein the first regulator transistor and the second regulator transistor have different aspect ratios.

11. A hold-off circuit, comprising:
    a delay line including a set of delay circuits disposed in series, wherein a delay circuit in the set includes:
    a first regulator, programmable to be enabled by a first digital voltage, the first regulator configured to cause only a first edge of an input signal to the delay circuit to be actively delayed by the delay circuit, wherein a second edge of the input signal is not actively delayed when the first regulator is enabled; and
    a second regulator, programmable to be enabled by a second digital voltage being a complement of the first digital voltage, the second regulator configured to cause only the second edge of the input signal to be actively delayed by the delay circuit, wherein the first edge of the input signal is not actively delayed when the second regulator is enabled;
    a selection terminal, which, when energized with the first digital voltage, enables the first regulator and disables the second regulator, and which, when energized with the second digital voltage, enables the second regulator and disables the first regulator.

12. The hold-off circuit of claim 11, wherein the delay line is a multiplexed delay line.

13. The hold-off circuit of claim 11, wherein, when enabled, the first regulator is configured by a first analog voltage to produce of a first amount of delay to the first edge, and wherein, when enabled, the second regulator is configured by a second analog voltage to produce a second amount of delay to the second edge.

14. The hold-off circuit of claim 13, wherein the first amount is equal to the second amount.

15. The hold-off circuit of claim 13, wherein the first amount is different than the second amount.

16. A delay circuit, comprising:
    a first current regulator;
    a second current regulator;
    wherein the first current regulator is configured to cause the delay circuit to be in a first delay resolution regime when enabled and when the second current regulator is disabled, and
    wherein the second current regulator is configured to cause the delay circuit to be in a second delay resolution regime distinct from the first delay resolution regime, when the second current regulator is enabled and the first current regulator is disabled.

17. The delay circuit of claim 16, wherein the delay circuit is an asymmetric delay circuit.

18. The delay circuit of claim 16, wherein the first delay resolution regime corresponds to a first edge of an input signal to the delay circuit being actively delayed and a second edge of the input signal not being actively delayed, and wherein the second delay resolution regime corresponds to the second edge being actively delayed and the first edge not being actively delayed.

19. The delay circuit of claim 18, wherein the first current regulator includes a first regulator transistor and the second current regulator includes a second regulator transistor.

20. The delay circuit of claim 19, wherein the first regulator transistor and the second regulator transistors have different aspect ratios.

* * * * *